(12) United States Patent
Psyk et al.

(10) Patent No.: US 7,977,212 B2
(45) Date of Patent: Jul. 12, 2011

(54) METHOD FOR MANUFACTURING A PHOTOVOLTAIC MODULE

(75) Inventors: Walter Psyk, Munich (DE); Peter Lechner, Vaterstetten (DE)

(73) Assignee: Schott Solar AG, Alzenau (DE)

(*) Notice: Subject to any disclaimer, the term of this patent is extended or adjusted under 35 U.S.C. 154(b) by 124 days.

(21) Appl. No.: 12/381,763

(22) Filed: Mar. 16, 2009

(65) Prior Publication Data
US 2009/0246904 A1    Oct. 1, 2009

(30) Foreign Application Priority Data
Mar. 19, 2008  (DE) .......................... 10 2008 014 948

(51) Int. Cl.
*H01L 21/00*    (2006.01)
(52) U.S. Cl. ............. 438/463; 438/940; 257/72; 257/59
(58) Field of Classification Search ................... 438/940, 438/463
See application file for complete search history.

(56) References Cited

U.S. PATENT DOCUMENTS
7,470,490 B2 * 12/2008 Nishikawa et al. ............... 430/5
2007/0163646 A1 * 7/2007 Kushiya et al. ............... 136/264

FOREIGN PATENT DOCUMENTS
DE       199 33 703 A1    10/2000
EP           1005096 A2 *  5/2000

* cited by examiner

*Primary Examiner* — Jarrett J Stark
*Assistant Examiner* — Nicholas Tobergte
(74) *Attorney, Agent, or Firm* — Miller, Canfield, Paddock and Stone; Mark L. Maki

(57) ABSTRACT

For manufacturing a photovoltaic module (1) having on a transparent substrate (2) a transparent front electrode layer (3), a semiconductor layer (4) and a back electrode layer (5) as functional layers, the functional layers (3-5) are removed in the edge area (10) of the substrate (2) with a laser emitting infrared radiation. Subsequently, a back cover (12) is laminated on the coated substrate (2) with an adhesive film (11).

14 Claims, 1 Drawing Sheet

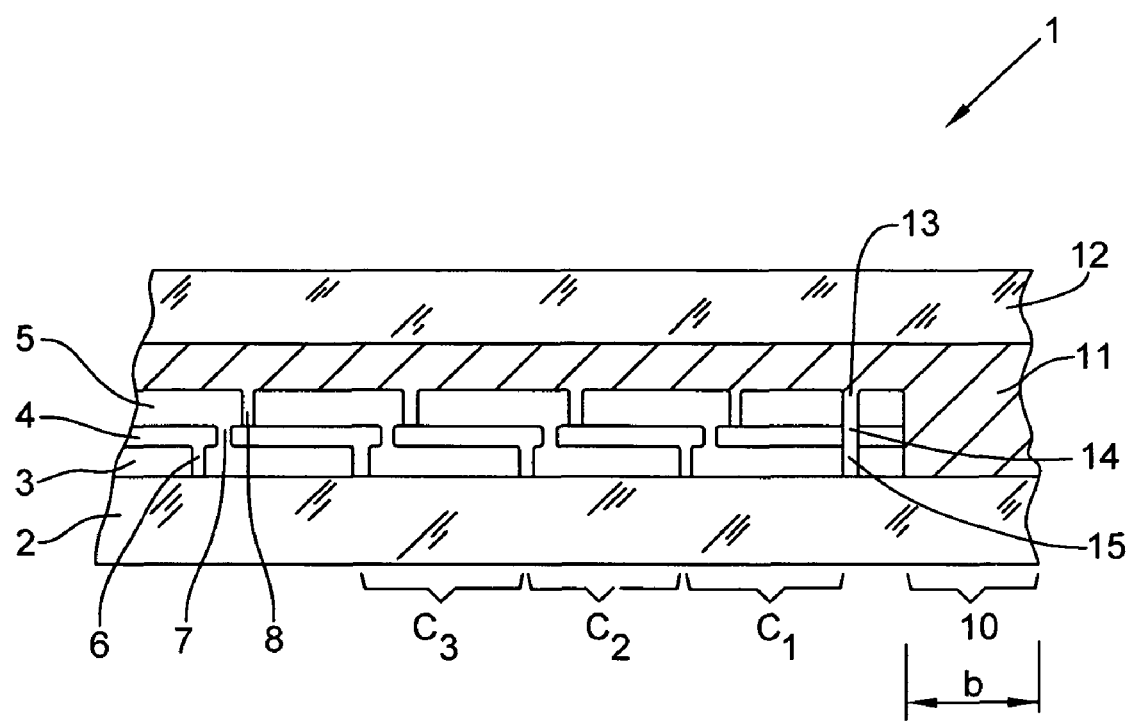

METHOD FOR MANUFACTURING A PHOTOVOLTAIC MODULE

This invention relates to a method for manufacturing a photovoltaic module according to the preamble of claim 1.

To ensure sufficient electrical insulation of the energized functional layers from the surroundings (frame, mounting rack, tilt-up rack) in particular in the damp or wet state during operation of a photovoltaic module, the functional layers must be removed from the substrate all around the edge of the module before the back cover is laminated on with the adhesive film, so that the back cover is connected directly to the substrate in the edge area with the adhesive film so as to effect a hermetic seal of the functional layers from the surroundings.

It is customary to remove the functional layers in the edge area of the module using mechanical methods such as blasting with corundum or grinding with grinding wheels. Thus, when the substrate is made of glass as usual, the glass surface is removed to a depth of a few μm to several tens of μm and considerably damaged with microcracks. This can have a negative effect on the mechanical strength of the glass plate. What is more serious, however, is the influence of mechanical treatment on the conductivity of the glass surface after the action of moisture.

When the surface resistance of soda-lime glass is determined after a surface treatment, for example by corundum blasting, similar values are found, at about $10^{13}$ ohms per square, as for unprocessed glass surfaces. However, when the samples are subjected to a damp-heat test at 85° C. and 85% relative humidity for 1000 h in accordance with the IEC standard 61646, the surface resistance of the blasted surface drops to $2\times10^9$ to $10^{10}$ ohms per square, while the resistance of the untreated glass surface remains almost unchanged at approximately $10^{13}$ ohms per square.

For a photovoltaic module with an area of 1 sqm and a circumference of 4 meters with an edge decoating 2 cm wide, the resulting insulation resistance to ground at the edge of the solar module is therefore only 10 to 50 MOhm. The abovementioned IEC standard requires an insulation resistance of at least 40 MOhm×$m^2$ after the damp-heat test, however, so that mechanical edge decoating involves the risk of not meeting the IEC qualification with regard to insulating strength. This applies in particular to large modules with an accordingly large circumference.

EP 1 005 096 A2 indicates that the functional layers can be removed in the edge area not only by the mechanical method but also by a laser. For this purpose there is used a YAG laser emitting laser light with a wavelength of 532 nm in the visible range, that is, a neodymium-doped laser. However, this cannot remove the front electrode layer. For when the laser beam is focused on the back electrode layer, there occurs from the start a complete absorption of the laser light by the back electrode layer or the semiconductor layer. The front electrode layer is just as little removed when the laser beam enters through the glass substrate, since the laser beam is not absorbed due to the transparency of the front electrode layer.

It is therefore the object of the invention to provide a method for edge decoating during manufacture of photovoltaic modules which has high productivity, on the one hand, and results in modules with high insulating strength, on the other hand.

This is achieved according to the invention by using a laser that emits infrared radiation for removing the three functional layers in the edge area of the module.

Surprisingly, such a laser permits all three functional layers to be removed although the semiconductor layer does not absorb the infrared radiation.

For the absorption of the laser radiation by the front electrode layer has the consequence that the front electrode layer is heated by the laser radiation such that both the semiconductor layer located thereabove and the back electrode layer, which likewise absorbs the laser radiation, are removed.

The transparent substrate can be a glass plate or consist of another electrically insulating transparent material.

The front electrode layer can consist of an electrically conductive metal oxide, for example tin oxide ($SnO_2$), in particular fluorine-doped tin oxide or another material. It is only essential that it is transparent and electrically conductive, and preferably absorbs at least 0.5%, in particular at least 2%, of the emitted infrared radiation of the laser.

The semiconductor layer can consist of silicon, for example amorphous, nano-, micro- or polycrystalline silicon, but also be another semiconductor, such as cadmium tellurium or CIGS, i.e. copper indium gallium selenide.

The back electrode layer is preferably a metal layer, consisting for example of aluminum, copper, silver or the like.

The adhesive film can be an EVA or PVB film or another hot-melt adhesive film. The back cover which is laminated on the coated substrate with the adhesive film can be a further glass plate or for example a plastic film or plastic plate.

The coated substrate and the back cover with the adhesive film as an inter-layer are then laminated under elevated pressure and generally elevated temperature so that, when the substrate and the back cover are in each case constituted by a glass plate, a laminated glass is formed in the edge area.

Since the back cover and the adhesive film also cover the edge area of the substrate along the total circumference of the module on which the functional layers have been removed, the functional layers in the module are sealed perfectly from the surroundings.

The laser used according to the invention emits infrared radiation, i.e. radiation with a wavelength of at least 800 nm, preferably at least 1000 nm, in particular a solid-state laser emitting in the near infrared range being used. The solid-state laser can also be a fiber laser or a disk laser.

The solid-state laser is preferably an Nd:YAG laser, i.e. it has yttrium aluminum garnet as the host crystal. Instead, the host crystal can also be an yttrium vanadate ($YVO_4$) for example. It is preferable to use neodymium for doping, i.e. to use a solid-state laser with a wavelength of 1064 nm. It is also possible to use erbium, ytterbium or another element for doping.

For removing the functional layers in the edge area of the coated substrate, the laser beam is focused on the functional layers through the transparent substrate. However, the laser beam can also be focused on the functional layers from the layer side, that is, the opposite side.

To ensure reliable layer ablation, the energy density of the laser beam focused on the functional layers should be at least 20 mJ/$mm^2$, in particular at least 50 mJ/$mm^2$.

It is preferable to use a laser that emits short laser pulses of less than 200 ns, in particular less than 100 ns. With longer laser pulses there is a danger of the material to be removed being heated only in part and removed only in part, and moreover of the thermal energy of the heated material damaging the substrate surface.

The power of the laser should be at least 100 W and the pulse repetition rate at least 1 kHz. The laser spots can be placed immediately next to each other with small overlap. The relative speed between laser beam and glass surface, should for this purpose be at least 1000 mm/s.

It is thus possible to carry out a successful ablation of the functional layers at a removal rate of 2000 $mm^2$/s for example at a laser beam energy density of 50 mJ/mm$^2$, a laser spot area of 1 mm$^2$, a laser power of 100 W and a pulse repetition rate of 2 kHz.

When the substrate glass used is for example a soda-lime glass, the surface resistance of the glass surface decoated inventively with the laser is more than 10$^{10}$ ohms per square, preferably more than 10$^{11}$ ohms per square, in particular more than 10$^{12}$ ohms per square, both immediately after treatment and after a damp-heat test at 85° C. and 85% relative humidity for 1000 hours.

The coated glass surface is further characterized by the fact that it is not damaged, i.e. has no microcracks or shelling. Although traces of residual material of the functional layers are visible at least under the microscope, they have no negative influence on the surface resistance.

The invention will hereinafter be explained more closely by way of example with reference to the attached drawing, whose single FIGURE shows a section through the part of a photovoltaic module with the edge area, the functional layers being shown greatly enlarged.

Accordingly, the photovoltaic module 1 has a transparent substrate 2, e.g. a glass plate, having deposited thereon one on the other three functional layers, i.e. a transparent front electrode layer 3, a semiconductor layer 4, for example consisting of amorphous silicon a-Si:H, and a back electrode layer 5.

The module comprises individual strip-shaped cells $C_1$, $C_2$, etc., which are series-connected by pattern lines 6, 7, 8. The generated current can be collected by contacting the two outer cells of the module 1, that is, the cell $C_1$ and the cell (not shown) on the other side of the module 1.

In the edge area 10 of the module 1 the functional layers 3, 4, 5 have been removed. In a module with an area of 1 m$^2$ the width b of the edge area can be for example 5 centimeters.

With the adhesive film 11, preferably a hot-melt adhesive film, a back cover 12, for example a glass plate, is laminated on the side of the substrate 2 provided with the functional layers 3, 4, 5. Thus the substrate 2 is firmly connected directly to the back cover 12 with the adhesive film 11 in the edge area 10, thereby sealing the functional layers 3 to 5 in the module 1 so that they are separated from the surroundings with a high electrical insulation resistance even under different climatic conditions, in particular in case of moisture but also temperature changes.

For manufacturing the module 1, the functional layers 3 to 5 are deposited on the substrate over the entire surface one after the other and provided in each case with the pattern lines 6, 7, 8 and the insulating lines 13, 14, 15 which electrically limit/terminate the solar cells $C_1$, $C_2$, etc. They are subsequently removed in the edge area 10. For ablating the three functional layers 3 to 5 there is used an Nd:YAG solid-state laser with its fundamental wavelength of 1064 nm, the laser beam being focused for example through the substrate 2 onto the functional layer 3.

Subsequently, the adhesive film 11 is placed on the substrate 12 provided with the functional layers 3 to 5 but decoated in the edge area 10, and the back cover 12 on the adhesive film 11, whereupon lamination is performed under pressure and optionally at elevated temperature, thereby causing the total module to be tightly sealed by the adhesive film 11.

The invention claimed is:

1. A method for manufacturing a photovoltaic module wherein a transparent front electrode layer, a semiconductor layer and a back electrode layer are deposited on a transparent substrate as functional layers, whereupon the functional layers are removed from the substrate in an edge area of the module with a laser emitting infrared radiation, and then a back cover is laminated on the substrate coated with an adhesive film, wherein the removal rate at which the functional layers are removed in the edge area of the module is at least 1000 mm$^2$/s through an energy density of the laser beam focused on the functional layers of at least 20 mJ/mm$^2$ and a pulse repetition rate of the laser of at least 1 kHz, with residual material remaining on the substrate in the edge area of the module.

2. The method according to claim 1, wherein the laser comprises a neodymium-doped solid-state laser with a wavelength of 1064 nm for removing the functional layers in the edge area.

3. The method according to claim 1, wherein the laser outputs laser pulses of less than 200 ns.

4. A method for manufacturing a photovoltaic module comprising:
providing a transparent substrate;
depositing a transparent front electrode layer on the transparent substrate;
providing pattern lines in the transparent front electrode layer;
depositing a semiconductor layer;
providing pattern lines in the semiconductor layer;
depositing a back electrode layer;
patterning the back electrode layer;
removing each of the transparent front electrode layer, the semiconductor layer and the back electrode layer to decoat an edge area about a periphery of the transparent substrate at a removal rate of at least 1000 mm$^2$/s by applying infrared radiation with a laser beam focused on the layers at an energy density of at least 20 mJ/mm$^2$ and at a pulse repetition rate of at least 1 kHz, and wherein residual material remains on the substrate in the edge area; and
laminating a back cover on the layers and substrate coated with an adhesive film.

5. The method according to claim 4, wherein the adhesive film about the perimeter of the edge area of the substrate provides a high electrical insulation resistance for the manufactured photovoltaic module and minimizes the effect of moisture on properties of the manufactured photovoltaic module.

6. The method according to claim 4, wherein the infrared radiation is applied by a neodymium-doped solid-state laser with a wavelength of 1064 nm to remove the layers in the edge area.

7. The method according to claim 6, wherein the solid-state laser outputs laser pulses of less than 200 ns.

8. The method according to claim 7, wherein the focused laser beam provide an energy density of at least 50 mJ/mm$^2$.

9. The method according to claim 4, wherein the laser beam moves at a speed of at least 1000 mm/s relative to a surface of the transparent substrate.

10. The method according to claim 4, wherein the residual material comprises traces of the layers.

11. The method according to claim 4, wherein the edge area has a width of 5 cm.

12. The method according to claim 4, wherein the method is free from the use of mechanical removal of the layers.

13. The method according to claim 4, wherein the transparent substrate consists of transparent glass, wherein the front electrode layer consists of an electrically conductive metal oxide, wherein the semiconductor layer consists of one of silicon, cadmium tellurium and copper indium gallium selenide, wherein the back electrode layer is a metal layer, wherein the adhesive film is a hot-melt adhesive, and wherein the back cover is one of a glass plate, plastic film or plastic plate.

14. The method according to claim 4, wherein the transparent substrate and the back cover each are constituted by a glass plate, so that a laminated glass is formed in the edge area about the periphery to seal the layers disposed in the photovoltaic module.

* * * * *